United States Patent
Li et al.

(10) Patent No.: US 8,603,913 B1
(45) Date of Patent: Dec. 10, 2013

(54) POROUS DIELECTRICS K VALUE RESTORATION BY THERMAL TREATMENT AND OR SOLVENT TREATMENT

(71) Applicant: Lam Research Corporation, Fremont, CA (US)

(72) Inventors: Nanhai Li, Pleasanton, CA (US); William Thie, Fremont, CA (US); Novy Tjokro, San Ramon, CA (US); Yaxin Wang, Fremont, CA (US); Artur Kolics, Dublin, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/723,064

(22) Filed: Dec. 20, 2012

(51) Int. Cl.
*H01L 23/52* (2006.01)

(52) U.S. Cl.
USPC ..... 438/625; 438/627; 438/687; 257/E21.586

(58) Field of Classification Search
USPC .................. 438/622–640, 687; 257/E21.576, 257/E21.586
See application file for complete search history.

(56) References Cited

U.S. PATENT DOCUMENTS

2010/0167535 A1* 7/2010 Nishiwaki et al. ............ 438/669

* cited by examiner

*Primary Examiner* — Thanhha Pham
(74) *Attorney, Agent, or Firm* — Beyer Law Group LLP

(57) ABSTRACT

A method for forming semiconductor devices on a substrate under a porous low-k dielectric layer, wherein features are formed in the porous low-k dielectric layer and wherein a barrier layer is formed over the porous low-k dielectric layer is provided. Contacts are formed in the features. The barrier layer is planarized. A cap layer is formed over the contacts, wherein the forming the cap layer provides metal and organic contaminants in the porous low-k dielectric layer. The metal contaminants are removed from the porous low-k dielectric layer with a first wet process. The organic components are removed from the porous low-k dielectric layer with a second wet process.

18 Claims, 4 Drawing Sheets

POROUS DIELECTRICS K VALUE RESTORATION BY THERMAL TREATMENT AND OR SOLVENT TREATMENT

BACKGROUND OF THE INVENTION

Field of the Invention

The invention relates to a method of forming semiconductor devices on a semiconductor wafer. More specifically, the invention relates to forming metal interconnects in low-k dielectric layers.

In forming semiconductor devices, conductive metal interconnects are placed in low-k dielectric layers. This may be done by depositing copper or a copper alloy into features etched into the low-k dielectric layer. Additionally, cap layers may be placed over the conductive metal interconnects. During the formation of these caps, however, the dielectric layer may become contaminated with metal and organic contaminants. The metal and organic contaminants, in turn, may increase the k-value above a desired level.

SUMMARY OF THE INVENTION

To achieve the foregoing and in accordance with the purpose of the present invention, a method for forming semiconductor devices on a substrate under a porous low-k dielectric layer, wherein features are formed in the porous low-k dielectric layer and wherein a barrier layer is formed over the porous low-k dielectric layer is provided. Contacts are formed in the features. The barrier layer is planarized. A cap layer is formed over the contacts, wherein the forming the cap layer provides metal and organic contaminants in the porous low-k dielectric layer. The metal contaminants are removed from the porous low-k dielectric layer with a first wet process. The organic components are removed from the porous low-k dielectric layer with a second wet process.

In another manifestation of the invention, a method for forming semiconductor devices on a substrate under a porous low-k dielectric layer, wherein features are formed in the porous low-k dielectric layer and wherein a barrier layer is formed over the porous low-k dielectric layer is provided. Contacts are formed in the features. The barrier layer is planarized. A cap layer is formed over the contacts to improve reliability of the contacts, wherein the forming the cap layer provides metal and organic contaminants in the porous low-k dielectric layer. The metal and organic contaminants are removed from the porous low-k dielectric layer.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In the formation of semiconductor devices, features such as trenches or vias are formed in a low-k dielectric layer. Additionally, metal interconnects such as copper interconnects are formed within the features. In one example, to prevent copper poisoning, a barrier layer, such as tantalum nitride/tantalum (TaN/Ta), is placed between the low-k dielectric layer and the copper interconnect. Further, copper contacts are formed. In one example, a copper/copper alloy seed layer is formed over the barrier layer. This seed layer is used for electroplating to grow a copper contact. Once the copper contacts are formed, the capper and barrier layers are planarized to expose a dielectric layer. Further, a cap layer (e.g., a cobalt layer or a cobalt alloy layer that is deposited by electroless plating or chemical vapor deposition) is formed over the copper contacts. In particular, the cap layer may be formed to improve the reliability of the copper interconnect. However, contaminants may be deposited in the dielectric layer during the formation of the cap layer. Contaminants may increase the k-value of the dielectric layer to a non-desirable level. Accordingly, once the cap layer has been formed, contaminants are removed from the dielectric layer so as to restore the low-k value.

Figure 1:
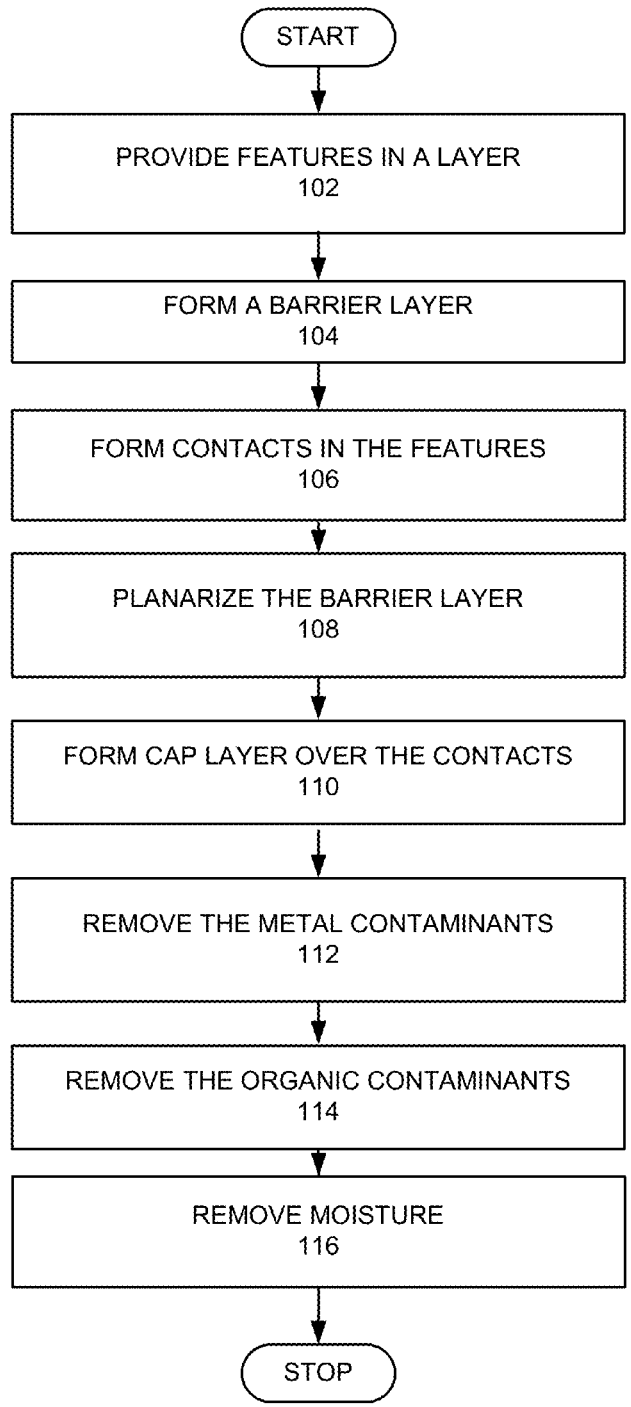
FIG. 1 is a flow chart of an embodiment of the invention.

FIG. 1 is a high level flow chart of an embodiment of the invention. In this embodiment, features are provided in a layer of a wafer (step 102). In particular, features are formed in a dielectric layer of the wafer. A barrier layer is formed (step 104). Additionally, the contacts are formed in the features (step 106). In particular, the features are filled with copper. Further, the barrier layer is planarized (step 108). In particular, chemical mechanical polishing (CMP) is used to planarize the barrier layer. Additionally, the copper layer may also be planarized along with the barrier layer. During the CMP, portions of the dielectric layer are exposed. Further, a cap layer is formed over the contacts (step 110). In one example, a selective cobalt tungsten phosphorous (CoWP) plating is provided on the tops of the copper deposit. In particular, the selective CoWP plating is provided on the tops of the copper deposit using a wet process. In this example, the wet process contaminates the exposed dielectric layer with metal and organic contaminants. Using a first wet process, the metal contaminants are removed (step 112). Further, using a second wet process, the organic contaminants are removed (step 114). Additionally, the moisture is removed (step 116). In one example, moisture is removed using a spin rinse. In another example, moisture is removed using an application of isopropyl alcohol (IPA). In another example, the copper deposit and CoWP layer are annealed.

Figure 2A:
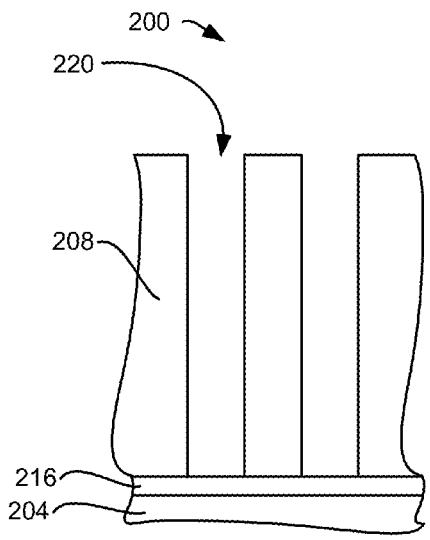
FIGS. 2A-C are schematic views of the formation of structures using the inventive process.

In a preferred embodiment of the invention, features are provided in a layer (step 102). FIG. 2A is a schematic cross-sectional view of a stack 200 with a substrate 204 with a layer 208 with features 220. In this example, one or more intermediate layers 216 are disposed between the substrate 204 and the layer 208. In this example, the layer 208 with features 220 is a dielectric layer. More preferably, the layer 208 is a porous low-k dielectric layer, with a k-value of less than 2.7. Additionally, layer 208 may be porous organosilicate glass (OSG). Further, features 220 may be formed by etching layer 208.

Figure 2B:
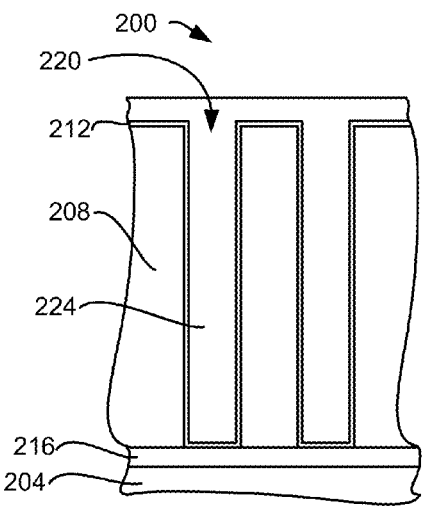

A barrier layer 212 may be formed over features 220 (step 104). In particular, a barrier layer 212, such as tantalum nitride/tantalum (TaN/Ta), may be placed across features 220. Barrier layer 212 may be formed to prevent metal poisoning, such as copper poisoning. Further, contacts 224 may be formed in the features 220 (step 106). As such, FIG. 2B is a schematic cross-sectional view of the stack 200 with a substrate 204 with a layer 208 having features 220 covered with a barrier layer 212. Additionally, in FIG. 2B, features 220 are filled with contacts 224, such as a copper deposit contacts. In this example, the copper deposit contacts are preferably provided using electroless copper deposition. In other embodiments, electroplating may be used. Additionally, other steps may be provided in other embodiments to form the contacts.

Figure 2C:
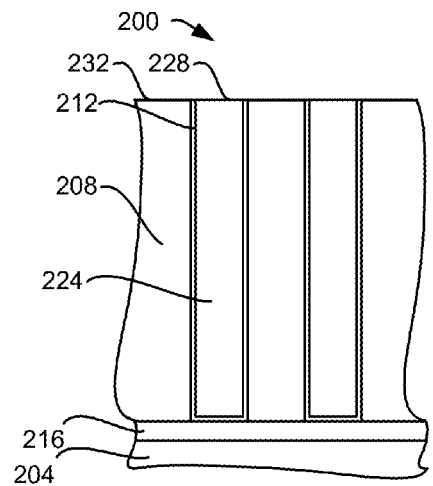

Once contacts 224 have been formed in the features 220, the contacts and the barrier layer 212 may be planarized. In particular, contacts 224, such as copper deposit contacts, and the barrier layer 212 may be planarized to expose the dielectric layer 208 as being even with the contacts 224 (step 108). Chemical mechanical polishing (CMP) may be used to polish the copper back to the tops of features 220, removing the barrier layer 212 that tops the dielectric layer as well as removing excess deposited copper outside of features 220. FIG. 2C is a schematic cross-sectional view of the stack 200 after the barrier layer 212 that tops the dielectric layer 208 as well as excess deposited copper outside of features 220 has been removed. The tops 228 of the copper deposit contacts 224 are even with the tops 232 of the layer 208 of the stack 200. In other embodiments, the tops 228 of the copper deposit contacts are not even with the tops 232 of the layer 208 of the stack 200. Further, in other embodiments, other methods may be used to remove excess copper over the stack 200 and expose tops of the contacts.

Figure 2D:
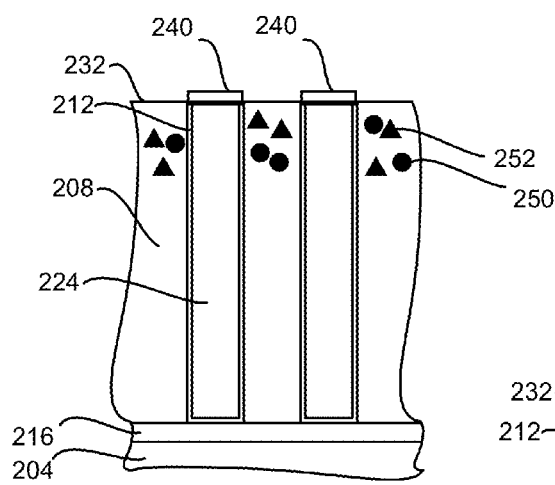
FIGS. 2D-F are schematic views of the removal of contaminants using the inventive process.

At step 110, a cap layer is formed. In one example, selective plating provides a cap 240 on top of each contact 224, such as copper deposit contacts. FIG. 2D is a schematic cross-sectional view of the stack 200 after the caps 240 have been selectively deposited on the tops 228 of the contacts 224. In particular, the plating may be a cobalt tungsten phosphorus (CoWP). The CoWP plating is selectively deposited on the tops 228 of the contacts 224 based on the metal in the contacts 224. For example, caps of CoWP may be selectively formed on copper contacts. Further, caps 240 may be formed with respect to the tops 232 of the layer 208. Such a selective deposition may be provided using electroless plating or electroplating. During the formation of caps 240 using a wet process, however, metal contaminants and organic contaminants are deposited. Metal contaminants are represented in FIG. 2D as circles 250 and organic contaminants are represented in FIG. 2D as triangles 252.

Figure 2E:
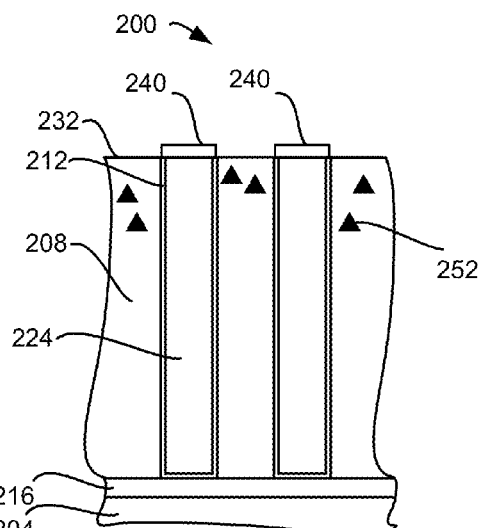

Metal contaminants 250 may be removed from the dielectric layer (step 112). Acidic solutions such as citric acid or oxalic acid may be used to remove metal contaminants from the dielectric layer. In particular, a post-clean solution may be used to remove metal contaminants represented as circles 250. The post-clean solution may contain some complexing agent to form complex compounds with the metal ions so as to keep them dissolved in the solution. As seen in FIG. 2E, a schematic cross-sectional view is provided of the stack 200 after the caps 240 have been selectively deposited on the tops 228 of the contacts 224 and after metal contaminants 250 have been removed.

Figure 2F:
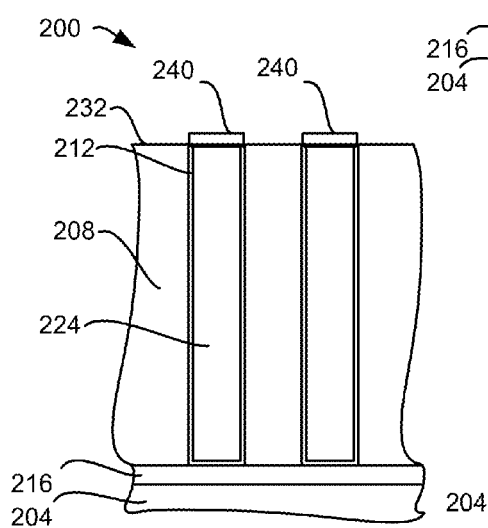

Organic contaminants 252 may be removed from the dielectric layer (step 114). In particular, an organic solvent, such as dimethyl sulfoxide (DMSO), may be used to remove organic contaminants represented as circles 252. Additionally, IPA may be used to remove organic contaminants. As seen in FIG. 2F, a schematic cross-sectional view is provided of the stack 200 after the caps 240 have been selectively deposited on the tops 228 of the contacts 224 and after metal contaminants 250 as well as organic contaminants 252 have been removed.

Additionally, moisture may be removed from the dielectric layer (step 116). In particular, the dielectric layer may be annealed. In particular, a treated wafer may be heated to a temperature between 100° C.-200° C. In a more preferred embodiment, the treated wafer may be heated to a temperature between 120° C.-170° C. In a most preferred embodiment, the treated dielectric wafer is heated to a temperature of 150° C. for one or two minutes. The heating of the dielectric wafer allows excess moisture to evaporate, which in turn lowers the k-value of the dielectric wafer.

The k-value shift caused by the CoWP electroless deposition (ELD) process may be decreased with solvent treatment using a solvent such as DMSO. Additionally, thermal anneal may also be used after a wafer dry step to reduce k-value shift caused by the CoWP ELD process. The thermal anneal may be carried out in the forming gas or inert gas environment. In an example, a CoWP electroless deposition process may include a pre-clean of an etched wafer. The precleaned wafer may then undergo a rinse with deionized water. Further, the CoWP may be deposited on the etched wafer using an electroless deposition. The wafer may then undergo a post-clean step. Further, the wafer may undergo a solvent treatment. In particular, a solvent treatment may include DMSO. Additionally, the wafer may undergo a rinse with deionized water and a drying through the use of isopropyl alcohol. After drying, the wafer may have a thermal k-restoration treatment, such as a thermal anneal.

Figure 3:
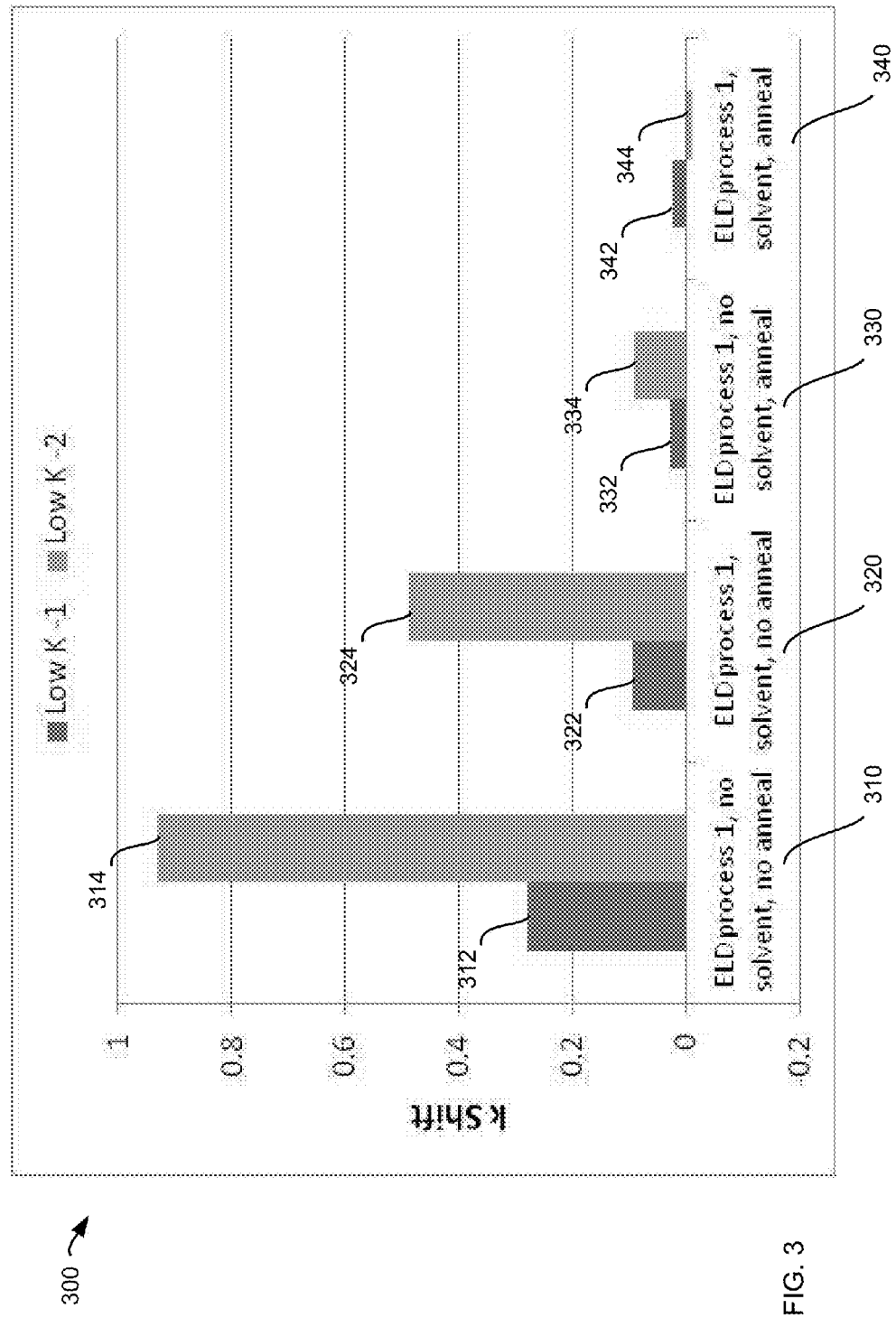
FIG. 3 is a comparison of ELD processes based on the influence of k-restoration treatments.

FIG. 3 illustrates a comparison 300 of different ELD processing methods in conjunction with k-value recovery treatments, such as solvent treatment and anneal treatment. In particular, FIG. 3 illustrates the impact of k-restoration treatments on a first low-k dielectric wafer ("Low K-1") and a second low-k dielectric wafer ("Low K-2"). As seen in FIG. 3, ELD process 310 comprises no solvent and no anneal as k-recovery treatments. Accordingly, Low K-1 (312) has a k shift value of ~0.3 and Low K-2 (314) has a k shift value of ~0.9.

ELD process 320 comprises a solvent but no anneal as k-recovery treatments. The use of a solvent alone, however, works to partially restore low-k values. Accordingly, Low K-1 (322) has a k shift value or ~0.1 and Low K-2 (324) has a k shift value of ~0.5. In contrast, ELD process 330 comprises no solvent but has an anneal as k-recovery treatment. The use of an anneal alone, however, also works to partially restore low-k values. Accordingly, Low K-1 (332) has a k shift value or ~0.02 and Low K-2 (334) has a k shift value of ~0.1. While the use of a solvent k-restoration treatment and an anneal k-restoration treatment both work to restore low-k treatments independently, low-k restoration when using both treatments is compounded when both are used. As such, ELD process 340 comprises a solvent as well as an anneal as k-recovery treatments. After ELD process 340, Low K-1 (342) has a k shift value or ~0.02 and Low K-2 (344) has a k shift value of ~0 or slightly negative.

Besides CoWP, other metals may also be used in cap layers. For example, some copper alloys may be used in cap layers, which may be copper with an alloy component of at least one of tin, cobalt, nickel, indium, ruthenium, rhenium, tungsten, molybdenum, palladium, gallium, germanium, zinc, or manganese. Preferably, the alloy component is at least 1% of the copper alloy. Additionally, cap layers may comprise at least one of tin, cobalt, nickel, indium, ruthenium, rhenium, tungsten, molybdenum, palladium, gallium, germanium, zinc, or manganese. The cap layer may be formed by electroless plating, or chemical vapor deposition or other deposition methods.

In embodiments discussed above, the low-k dielectric layer is a porous low-k dielectric material. Generally, the low-k dielectric material may be CORAL™ from Novellus of San Jose, Calif.; Black Diamond™ from Applied Materials of Santa Clara, Calif.; Aurora™ available from ASM International N.V., The Netherlands; Sumika Film® available from Sumitomo Chemical America, Inc., Santa Clara, Calif.; HOSP™ from Allied Signal of Morristown, N.J.; SiLK™ or advanced porous SiLK from DOW Chemical Company; Orion® Flowfill™ from Trikon; and LKD™ from JSR Corp. More specifically, in this example the low-k dielectric layer is porous organosilicate glass (OSG). In other embodiments, other low-k dielectric materials may be used. In the specification and claims, a low-k dielectric material has a dielectric constant of less than 2.7.

While this invention has been described in terms of several preferred embodiments, there are alterations, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method for forming semiconductor devices on a substrate under a porous low-k dielectric layer, wherein features are formed in the porous low-k dielectric layer and wherein a barrier layer is formed over the porous low-k dielectric layer, comprising:
   forming contacts in the features;
   planarizing the barrier layer;
   forming a cap layer over the contacts, wherein the forming the cap layer provides metal and organic contaminants in the porous low-k dielectric layer;
   removing the metal contaminants from the porous low-k dielectric layer with a first wet process; and
   removing the organic contaminants from the porous low-k dielectric layer with a second wet process.

2. The method, as recited in claim 1, further comprising annealing the substrate after removing the metal and organic contaminants from the porous low-k dielectric layer.

3. The method, as recited in claim 2, wherein removing the organic contaminants from the porous low-k dielectric layer comprises providing a solvent of at least one of DMSO or IPA.

4. The method, as recited in claim 3, wherein the forming the cap layer comprises using a wet or dry process.

5. The method, as recited in claim 4, wherein the annealing the substrate comprises heating the substrate to a temperature between 90 degrees C. and 400 degrees C.

6. The method, as recited in claim 5, wherein the removing the metal contaminants from the porous low-k dielectric layer comprises using citric acid.

7. The method, as recited in claim 5, wherein the removing the metal contaminants from the porous low-k dielectric layer comprises using oxalic acid.

8. The method, as recited in claim 1, wherein the contacts comprise a copper layer.

9. The method, as recited in claim 8, further comprising:
   planarizing the copper layer.

10. The method, as recited in claim 9, wherein the barrier layer and the copper layer are planarized simultaneously.

11. The method, as recited in claim 1, further comprising:
    removing moisture from the porous low-k dielectric layer.

12. The method, as recited in claim 1, wherein the porous low-k dielectric layer is a porous organosilicate glass.

13. The method, as recited in claim 1, wherein the contacts are formed using at least one of electroless copper deposition or electroplating.

14. The method, as recited in claim 1, wherein removing the organic contaminants from the porous low-k dielectric layer comprise providing a solvent of at least one of DMSO or IPA.

15. The method, as recited in claim 1, wherein the forming the cap layer comprises using a wet or dry process.

16. The method, as recited in claim 2, wherein the annealing the substrate comprises heating the substrate to a temperature between 90 degrees C. and 400 degrees C.

17. The method, as recited in claim 1, wherein the porous low-k dielectric layer comprises a porous low-k dielectric material having a dielectric constant of less than 2.7.

18. A method for forming semiconductor devices on a substrate under a porous low-k dielectric layer, wherein features are formed in the porous low-k dielectric layer and wherein a barrier layer is formed over the porous low-k dielectric layer, comprising:
   forming contacts in the features;
   planarizing the barrier layer;
   forming a cap layer over the contacts to improve reliability of the contacts, wherein the forming the cap layer provides metal and organic contaminants in the porous low-k dielectric layer;
   removing the metal contaminants and the organic contaminants from the porous low-k dielectric layer.

* * * * *